United States Patent
Traub

(10) Patent No.: US 6,265,878 B1
(45) Date of Patent: Jul. 24, 2001

(54) RELIABLE TRAILER TESTER

(75) Inventor: Thomas C. Traub, Warren, PA (US)

(73) Assignee: Betts Industries, Inc., Warren, PA (US)

( * ) Notice: Subject to any disclaimer, the term of this patent is extended or adjusted under 35 U.S.C. 154(b) by 0 days.

(21) Appl. No.: 09/165,813

(22) Filed: Oct. 2, 1998

Related U.S. Application Data

(63) Continuation-in-part of application No. 08/821,000, filed on Mar. 20, 1997, now abandoned.

(51) Int. Cl.[7] .................................................. G01R 31/02
(52) U.S. Cl. .................... 324/504; 324/503; 340/825.72; 340/539
(58) Field of Search ..................................... 324/503, 504, 324/512, 527, 537, 414; 340/825.69, 825.72, 458, 514, 539; 314/9

(56) References Cited

U.S. PATENT DOCUMENTS

| | | |
|---|---|---|
| 3,183,435 | 5/1965 | Donville et al. . |
| 3,428,888 | 2/1969 | Nolte . |
| 3,663,939 | 5/1972 | Olsson . |
| 4,021,730 | 5/1977 | Brinegar . |
| 4,177,420 | 12/1979 | Tripp . |
| 4,586,370 | 5/1986 | Massender . |
| 4,866,390 | 9/1989 | Butchko . |
| 4,884,032 | 11/1989 | LaPensee . |
| 5,025,253 | 6/1991 | DiLullo et al. . |
| 5,086,277 | 2/1992 | Hammerly . |
| 5,095,276 | 3/1992 | Nepil . |
| 5,142,278 | 8/1992 | Moallemi . |
| 5,192,912 | 3/1993 | Lemon . |
| 5,311,138 | 5/1994 | Ott et al. . |
| 5,416,421 | 5/1995 | Doland, Sr. et al. . |
| 5,500,637 | * 3/1996 | Kokubu ............................ 340/825.69 |
| 5,602,482 | 2/1997 | Gutierrez . |
| 5,604,439 | 2/1997 | Walkington et al. . |
| 5,635,843 | 6/1997 | Borland . |
| 5,640,139 | 6/1997 | Egeberg . |
| 5,650,774 | 7/1997 | Drori . |
| 5,745,033 | * 4/1998 | Jenkins et al. ....................... 340/539 |
| 5,748,669 | 5/1998 | Yada . |
| 6,066,951 | * 5/2000 | Maass ................................. 324/414 |

\* cited by examiner

*Primary Examiner*—Glenn W. Brown
(74) *Attorney, Agent, or Firm*—James C. Simmons

(57) ABSTRACT

Apparatus and method for testing operation of devices on a vehicular trailer without the necessity of a truck being connected thereto. A digital signal which is different for each device to be tested is encoded and wirelessly transmitted. Upon receipt of the signal, a power source is connected to the respective device to be tested. In order to reliably apply the signal in a multiplexed system in the trailer, the signal is mixed with a pseudorandom digital sequence to provide a direct sequence spread spectrum for the signal.

16 Claims, 9 Drawing Sheets

RELIABLE TRAILER TESTER

This application is a continuation-in-part of U.S. patent application Ser. No. 08/821,000, filed Mar. 20, 1997, now abandoned, which application is hereby incorporated herein by reference.

The present invention relates generally to the testing of systems such as lighting and brakes on a trailer.

With tractor-trailer combinations, a tractor or trailer may be attached to several other units during the day. Due to those constraints, the units must be serviced when time allows and personnel are available. It is therefore often desirable to test the lighting on trailers when tractors are not hooked up to them and therefore not supplying power to the lighting from the tractor's electrical system. For this purpose, a separate self-contained power source is required, and it is necessary that the testing device be connected into the trailer's electrical wiring. Since the lighting must be viewed by a person from different positions around the trailer, it is considered desirable that the testing device be remotely controlled so that the testing may be conveniently and quickly conducted by one person.

U.S. Pat. No. 4,586,370 to Massender, which is incorporated herein by reference, discloses a tester for testing electric and pneumatic systems of vehicular trailers without use of an associated truck or tractor. The tester provides a small portable hand held transmitter which has at least 4 normally open switches which are closable to communicate control signals to a radio receiver. The receiver in turn communicates through an electro mechanical switching mechanism to selectively operate an electric system and a pneumatic system both of which may be interconnected to the respective systems of a vehicular trailer. Other art which may be of interest includes U.S. Pat. Nos. 3,428,888; 4,866,390; 4,884,032; 5,086,277; 5,416,421; 5,602,482; 5,142,278; 5,748,669; 5,650,774; 5,025,253; 5,095,276; and 5,640,139.

The transmission of signals in the Massender tester is sensitive to the effects of interference signals, which may disrupt the operation thereof. Furthermore, signals which the Massender tester provides are not usable with multiplex-wired systems.

It is accordingly an object of the present invention to provide a remote trailer tester which is reliable.

It is a further object of the present invention to provide such a remote trailer tester which provides signals which may be directly inputted to multiplex-wired systems.

In order to provide a reliable remote trailer tester which has multiplex signaling capability, in accordance with the present invention, the tester transmitter, which has a first electrical power source, encodes and wirelessly transmits a digital signal which is different for each device to be tested. The receiver, which has a second electrical power source, decodes the wirelessly transmitted signal and, in response thereto, connects the second power source to the corresponding device to be tested without the necessity of the tractor being connected to the trailer.

The above and other objects, features, and advantages of the present invention will be apparent in the following detailed description of the preferred embodiments thereof when read in conjunction with the accompanying drawings wherein the same reference numerals denote the same or similar parts throughout the several views.

DETAILED DESCRIPTION OF THE PREFERRED EMBODIMENTS

Figure 1:
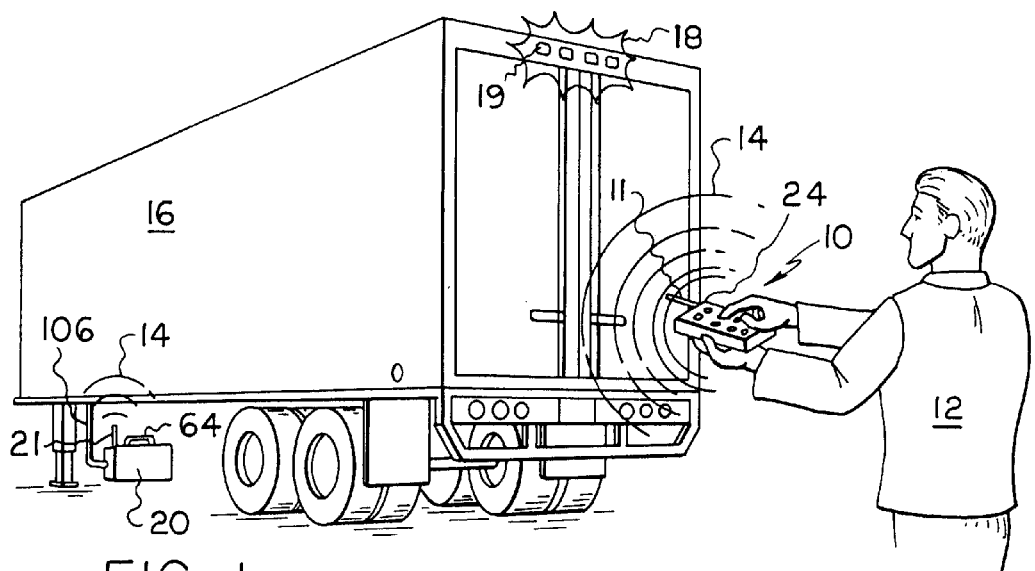
FIG. 1 is a perspective view illustrating the operating of apparatus including a transmitter and a receiver which embodies the present invention for testing lighting on a trailer.

Referring to FIG. 1, there is illustrated generally at 10 a transmitter for transmission by a person 12 of a signal, illustrated at 14, to a remotely-located receiver, illustrated generally at 20, which is connectable, as described hereinafter, to the electrical system of a trailer 16 for operation of selected lights, as illustrated at 18, or other devices on the trailer 16 so that the person may observe them thereby testing or checking the functioning thereof. Testing of lights requires the person 12 to walk around the back and both sides of the trailer 16. The remotely-held transmitter 10 allows the person to conveniently and quickly check the lighting without requiring the assistance of another person. The receiver 20, which may be placed on a wheeled cart (not shown) is placed adjacent a suitable electrical connector on the trailer and connected thereto as hereinafter described.

The receiver 20 includes a 12 volt D.C. battery 22 or other power source suitable for energizing lights 18 and other devices to be tested, whereby the lights and other devices may be tested without hooking up a truck or tractor to use its power supply.

Signals are transmitted wirelessly between the transmitter 10 and receiver 20, i.e., wires do not connect the transmitter 10 and receiver 20 for transmission of signals there between, but, instead, signals are transmitted electromagnetically by means of antenna 11 on transmitter 10 to antenna 21 on receiver 20 or otherwise through the atmosphere (but not through wires) there between.

Electromagnetic signals may encounter various forms of interference which may affect the quality of the signals so that the reliability of the remotely transmitted signals is compromised. It is considered that a very reliable signal is required for use with multiplexed wiring systems as are increasingly being provided on trailers. In order to provide a reliable signal suitable for a multiplexed wiring system, in accordance with the present invention, a digital signal is encoded for each device to be tested and transmitted to a receiver. In response to the received signal, the receiver connects the battery 22 (illustrated in FIGS. 4 and 5) to the particular device for which the signal was encoded.

Digital transmission advantageously allows the use of spread spectrum techniques for reliably transmitting the encoded signals so that the signals may be reliable enough to be used with multiplexed circuitry. These techniques include, but are not limited to, direct sequence, chirping, frequency hopping, time domain, time hopping, pure digital signals, and frequency shift keying, which allow the testing of devices in addition to lighting and brake systems.

Figure 2:
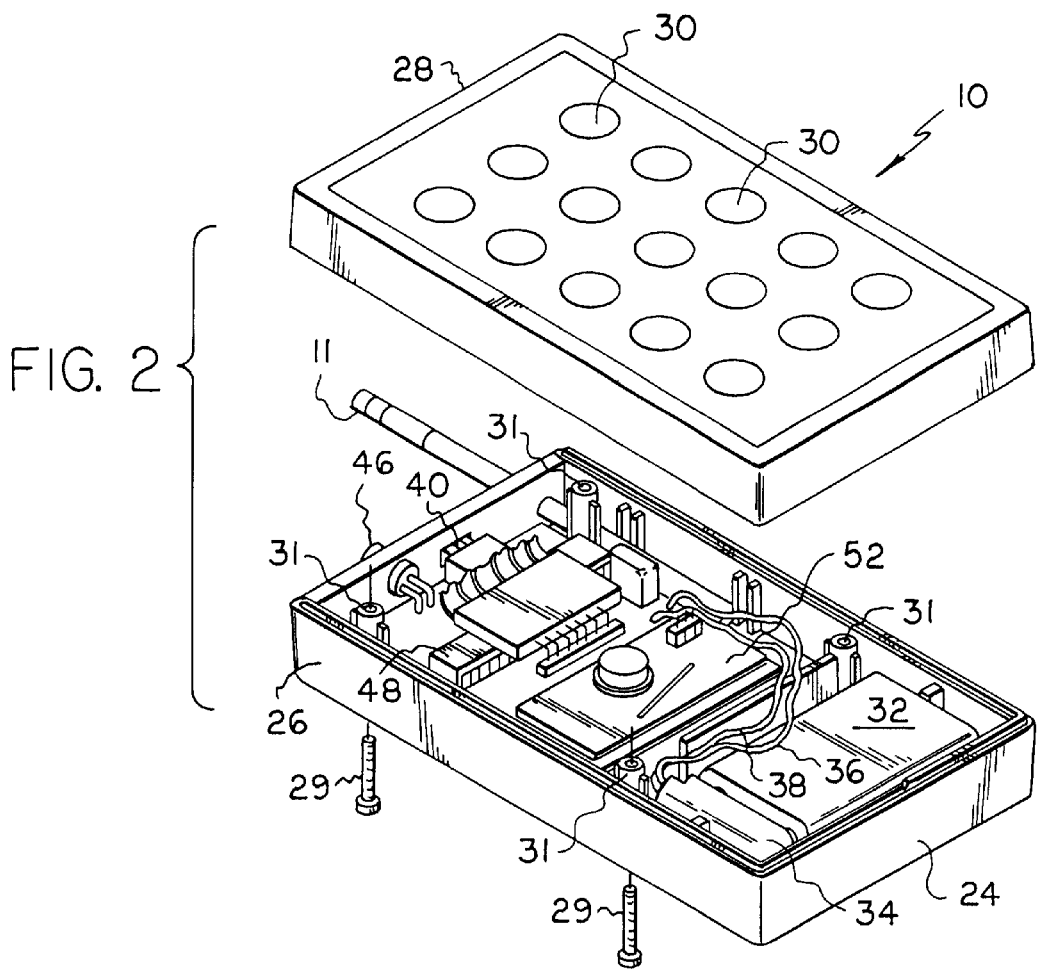
FIG. 2 is a partially exploded perspective view of the transmitter.
Figure 3:
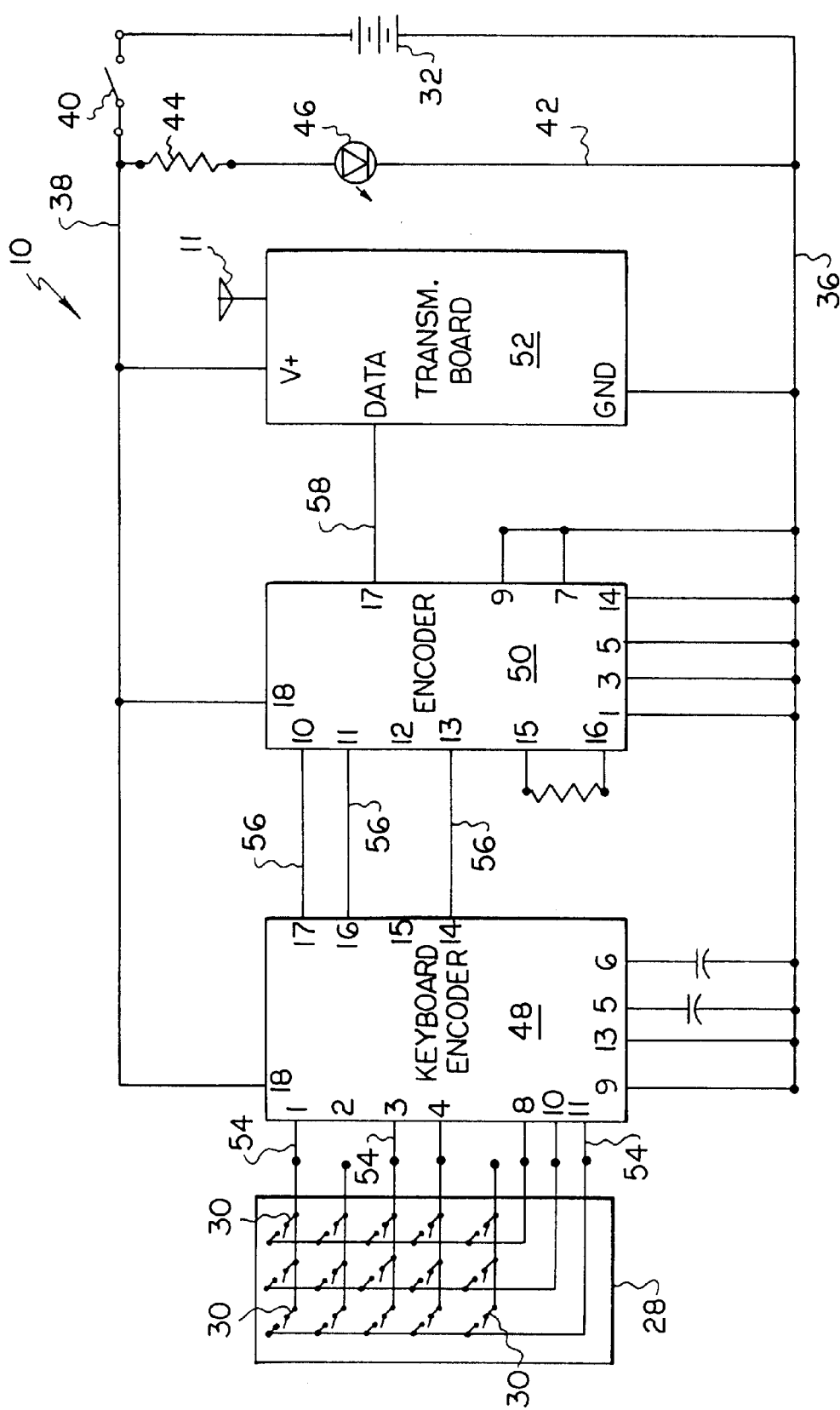
FIG. 3 is a schematic view of the transmitter.

Referring to FIGS. 2 and 3, the transmitter 10 is housed in a suitable hand-held plastic case 24. The case 24 includes a bottom or body portion 26 and an upper lid portion 28. Incorporated into the lid portion are a plurality of perhaps 15 built-in membrane switches 30 each for the energizing of a different device on the trailer 16. The case portions 26 and 28 are connected by perhaps four screws 29 received in apertures 31 in the lower case portion 26 and which threadedly engage threaded apertures (not shown) in case portion 28. A suitable combination case 24 and membrane switches 30 is model K-HML-9VB-SP marketed by Pactec, a division of LaFrance Corp., of Philadelphia, Pa.

A 9-volt battery 32 or other suitable power source is provided for powering the transmitter 10, and connection is made to the other transmitter components by clip 34 and conductor lines 36 and 38. On/off switch 40 is provided in one of the lines 38 for closing for supplying power to the transmitter circuitry and thereby activating the transmitter 10. Current flowing in line 42 in parallel with the battery 32 through a suitable resistor 44 and light emitting diode 46 causes the diode 46 to emit light thereby indicating that the transmitter 10 is activated.

A keyboard encoder chip, encoding circuit chip, and transmitter board chip, illustrated at 48, 50, and 52 respectively, are each connected in parallel with the battery 32. A suitable keyboard encoder chip 48 for the transmitter may, for example, be no. 74C922 and suitable integrated circuits 124 and 132 (illustrated in FIG. 5) for the receiver may, for example, be nos. CD4028 and CD4093 respectively, which are described hereinafter, marketed by any number of companies including National Semiconductor and Motorola. A suitable encoding circuit chip 50 for the transmitter may, for example, be no. HT12E and a suitable integrated circuit 122 (illustrated in FIG. 5) for the receiver may, for example, be no. HT12D, which are described hereinafter, are marketed by Holtek Microelectronics, Inc. of Hsinchu, Taiwan, and a suitable transmitter board 52 is model TX-66 marketed by Ming Engineering & products, Inc. of City of Industry, CA. A plurality of lines 54 connect the membrane switches 30 to the keyboard encoder 48 and are wired to the switches 30 such that a current flow through two of the lines 54 will indicate that a particular switch 30 is closed, in accordance with principles commonly known to those of ordinary skill in the art to which this invention pertains. FIG. 3 shows 6 of the switches not connected to the keyboard encoder.

The keyboard encoder 48 scans the various circuit combinations provided by lines 54 for detecting closure of a membrane switch 30. Upon detection of a switch closure, the integrated circuit 48 is programmed to produce a digital signal equivalent which is then passed to the encoding circuit 50 via lines 56. The transmitter is suitably constructed, in accordance with principles commonly known to those of ordinary skill in the art to which this invention pertains, to cancel a switch closure when there is a subsequent switch closure. The encoder circuit 50 then assigns a digital prefix code, identifying the transmitter 10 as the originator of the signal, to the data and inputs a serial bit stream equivalent via line 58 to the transmitter board 52, which then suitably transmits the signal 14 such as electromagnetically. The transmitter board 52 may, for example, be a 310 megahertz s.a.w. transmitter but may be any other suitable transmitter such as one that transmits acoustically or by light.

Figure 4:
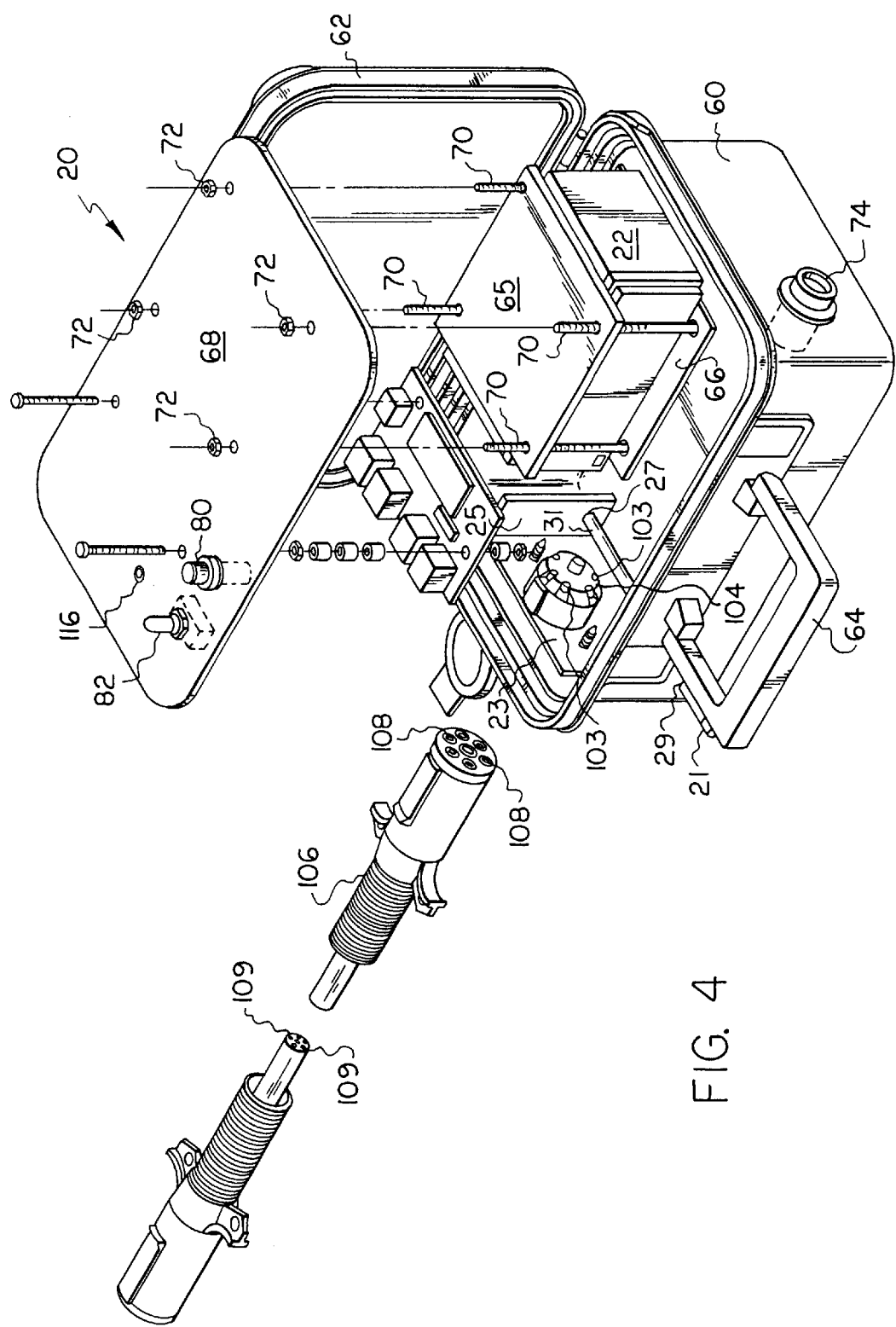
FIG. 4 is a view similar to that of FIG. 2 of the receiver.
Figure 5:
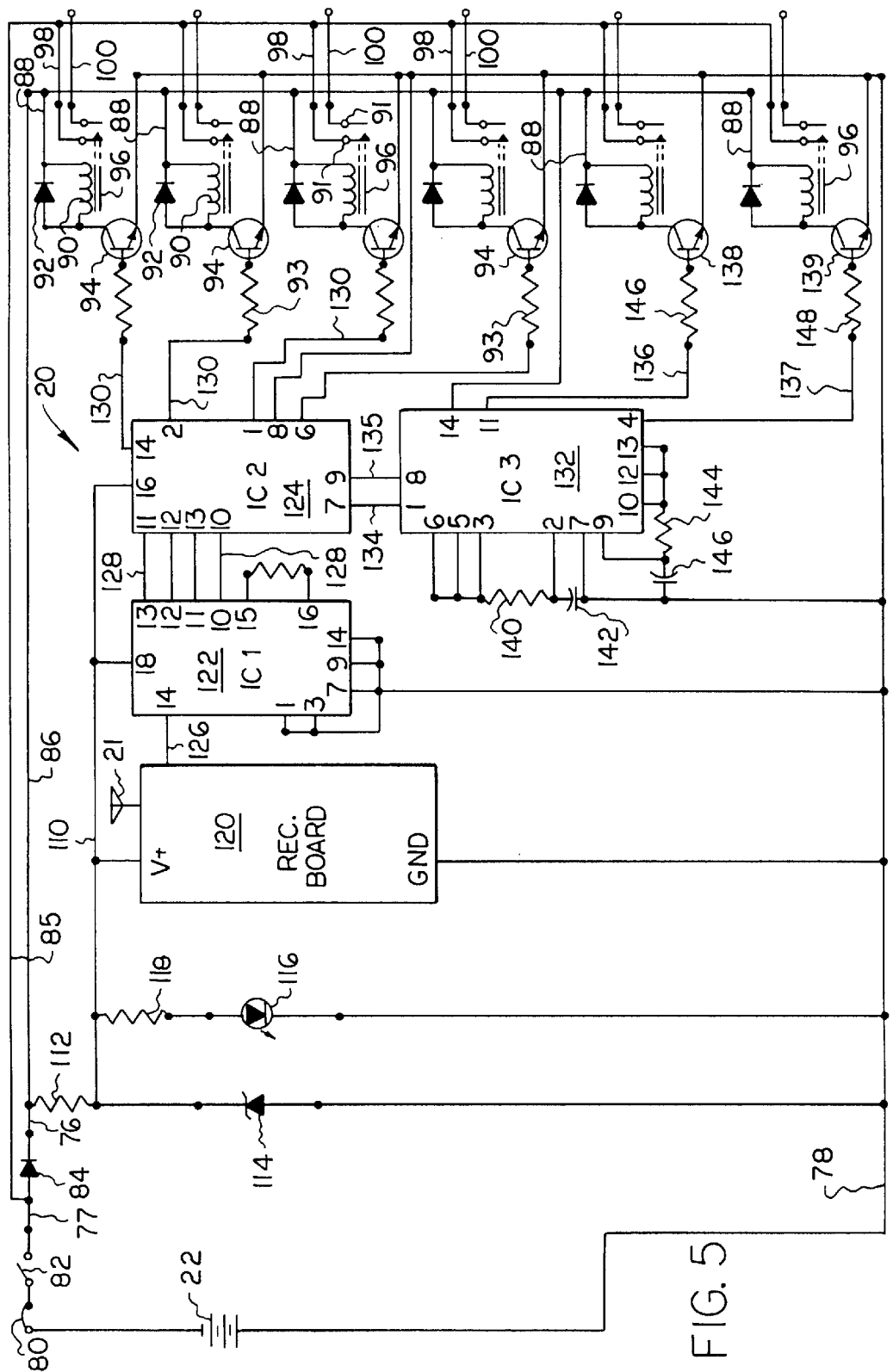
FIG. 5 is a schematic view of the receiver.

Referring to FIGS. 4 and 5, the battery 22 and other circuit components for receiver 20 are contained within a plastic case 60 having a hinged lid 62 and a handle 64. The battery 22 is secured in place between upper and lower plates 65 and 66 respectively and secured by upper cover 68 by perhaps 4 bolts 70 and nuts 72. A receptacle 74 is provided through which the battery 22 may be recharged. The battery 22 supplies power to the receiver circuitry as well as devices to be tested via lines 77 and 78. One of the lines 77 includes a resettable protective fuse 80 and an on/off power switch 82.

After passage through the closed switch 82 in line 76, the battery current passes into line 76. Line 85 is in parallel with line 76. After passage through diode 84 in line 76, the battery current passes through line 86 to each of parallel lines 88. Each line 88 has a relay coil 90 with a diode 92 in parallel therewith and connects to the collector of a suitable transistor 94. Battery line 78 is connected to the emitter of each of the transistors 94 thus completing a circuit when a respective transistor 94 is turned on. When the respective coil 90 is energized upon turning on of the respective transistor 94, normally open contacts on a respective relay 96 are closed, as is known in the art to which this invention pertains, to complete a circuit between battery 22 and the respective device to be tested thereby activating the respective device. Thus, upon closure of contacts 91, battery current flows through line 85 then through respective parallel line 98 to the relay contacts 91, then through respective line 100 to the respective device to be tested, then back to the battery via line 78. Relays 96 may, for example, be Bosch relays. Alternatively, other types of switching devices such as, for example, power transistors with suitable heat-sinking material or MOSFET transistors may be used instead of relays. Lines 100 as well as the return to battery 22 are routed to a terminal 104 in the side of the case 60 which is shown to be a 7 pin terminal, but may be any other suitable terminal. A cable 106 containing perhaps 7 corresponding conductors 108 connects the terminal 104 to the trailer 16 so that the lines 100 are connected to the respective devices on the trailer, and the cable has suitable terminations on each end per the configuration of each trailer.

Line 110, which contains current reducing resister 112, is in parallel with line 86 to the relay coils 90. Connected between lines 110 and 78 is a zener diode 114 for shunting of over-voltage thereby acting as a voltage regulator. Connected in parallel with zener diode 114 is a light emitting diode 116 for indicating that the receiver 20 is in operation. A suitable resister 118 is in series with LED 116 for regulating the current flow therethrough.

A receiver board 120 and first and second integrated circuits 122 and 124 respectively are each in parallel with the LED 116. Upon reception of a transmission at a predetermined frequency by antenna 21, the receiver board 120 transmits the detected signal via line 126 to the first or decoding integrated circuit 122. The antenna 21 is received through an aperture, illustrated at 29, in a wall of the receiver 20. The inner end portion, illustrated at 31, of the antenna 21 is received in an aperture, illustrated at 27, of portion 25 of an L-shaped bracket 23 and is soldered to the antenna lead (not shown) and to the bracket portion 25 to secure the antenna 21 in position. A suitable receiver board may be model RE-66 marketed by Ming Engineering & Products Inc. of City of Industry, CA.

The first integrated circuit 122 checks for the coded prefix and, if a valid coded prefix is received, removes it and converts the serial bit stream to the corresponding binary sequence which is then sent via lines 128 to the second integrated circuit 124. Integrated circuit 124 then sends a signal through one of a plurality of lines 130 to a respective current limiting resistor 93 then to the base of the respective transistor 94 for the trailer device corresponding to the binary sequence. Upon passage of current to the base, the respective driving transistor 94 is activated so that current may pass through the respective coil 90 thereby creating a magnetic field to effect closure of the normally open contacts of the relay 96 for powering the respective trailer device.

For left and right turn signal indicators or other trailer devices which have flashing lights or require intermittent signals, the second integrated circuit does not send signals directly to the transistors but instead routes the signals to third integrated circuit 132 via one of lines 134 and 135 for left and right turn signals respectively. Thus, if either pin for lines 134 and 135 is active, the output is sent to integrated circuit 132. The third integrated circuit 132 includes suitable circuitry, in accordance with principles commonly known to those of ordinary skill in the art to which this invention pertains, for providing an astable multivibrator pulse through a respective line 136 or 137 to the base of a respective transistor 138 or 139 (which may be similar to transistors 94) to operate the respective solenoid 96 (intermittently) to supply energy to the respective left or right turn signal. Integrated circuit 132 is thus suitably configured in accordance with principles commonly known to those of ordinary skill in the art to which this invention pertains, such that, upon receipt of a valid signal from integrated circuit 124 via either of lines 134 or 135, an alternating high/low pulse whose speed is determined by either resistor 140 and capacitor 142 or by resistor 144 and capacitor 146 is output to lines 136 or 137 and their associated resistors 146 or 148 respectively, which limit the current to the base connections of relay driving transistors 138 and 139 respectively. As previously described for transistors 94, current to the base of either transistor 138 or 139 activates the transistor to effect closure of the normally open contacts of the respective relay 96.

Upon closure of the contacts for a relay 96, power then flows through lines 98 and 100 to the respective pin 103 on connector 104 and through the respective line 109 which begins at the respective terminal 108 in the interconnecting cable 106 to the trailer 16 and activates the respective light or other device for observation by the person 12. Upon deactivation of the relay and collapse of the magnetic field, the respective protective diode 92 shunts power away from the respective driving transistor.

If desired, in order to allow additional devices to be added for testing, the pin terminals 103 in socket 104 may be split to allow for twice the number of circuits, i.e., two instead of one circuit per pin. This allows the seven pin connector 104 to hold 14 circuits instead of the usual 7 circuits. The connector 104 may desirably be constructed to conform to S.A.E. specification J560 or J1239 or other suitable standard. The cable 106 is suitably adapted to have 14 terminals for use with the split-pin connector.

Figure 7:
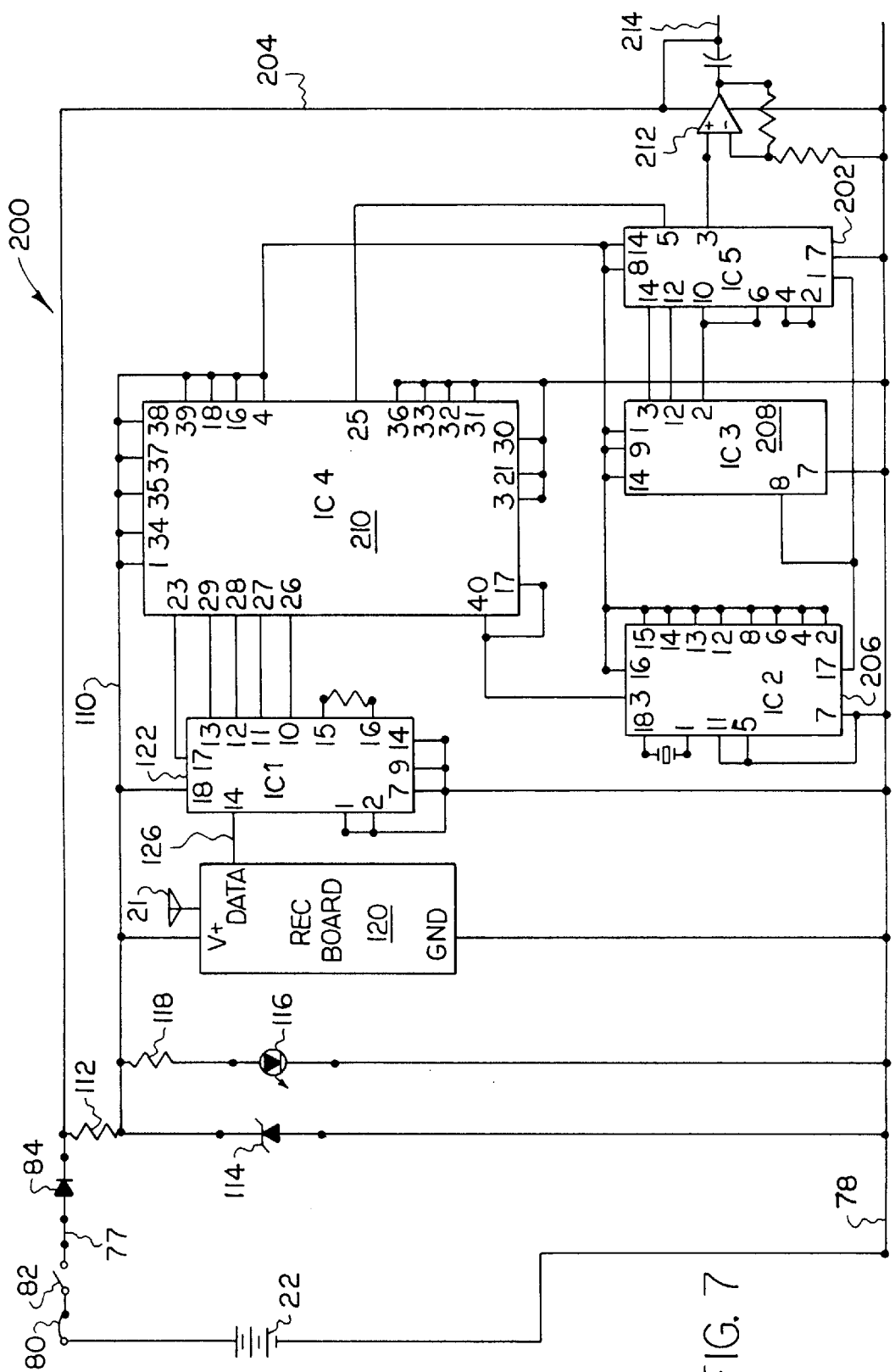
FIG. 7 is a schematic view of an alternative embodiment of the receiver.

Referring to FIG. 7, there is illustrated generally at 200 a receiver which processes the received signal from transmitter 10 in a direct sequence spread spectrum sequence for transmission over the trailer's multiplex lines for pick-up of the signal by the local circuitry for the respective device to be tested so that the device is operated for testing of it. Upon closure of on/off switch 82, full voltage is applied to integrated circuit 202 via lines 78 and 204. Power also flows through dropping resistor 112 and activates light emitting diode 116 similarly as for receiver 20 and supplies power at the reduced voltage along line 110, which is parallel to line 204, for receiver board 120 and for integrated circuits 122, 206, 208, and 210. The receiver board 120 is thus activated upon closure of switch 82.

Upon receipt of a signal at the selected frequency, it is applied by the receiver board 120 to the decoding circuit 122 via line 126. Upon confirmation of a valid decoded data stream transmission, i.e., the coded prefix matches, the coded prefix is removed and the digital data is transferred to universal asynchronous receiver/transmitter circuit 210. Integrated circuit 206 provides crystal controlled timing pulses to integrated circuits 202, 208, and 210. Chip 210 converts the data into a serial bit stream which is output to integrated circuit 202. Integrated circuit 208 is suitably configured as a source of a pseudorandom digital sequence. This sequence is then output to integrated circuit 202 where it is mixed with the data bit stream. Mixing of the signals in integrated circuit 202 produces a direct sequence spread spectrum output which is then sent to signal boosting integrated circuit 212. The boosted signal is then output over the carrier or power lines 214 and 78 which are suitably connected to multiplex lines on the trailer where the signal is routed by the lights and other devices to be tested on the trailer and is picked up (read) by local circuitry for the respective device for which the signal is coded, similarly as shown and discussed with reference to FIG. 8, using principles commonly known to those of ordinary skill in the art to which this invention pertains.

The spread spectrum signal thus generated is spread over a wide band width so that the information is readable on multiplexed lines in the trailer by local circuitry for the lights or other devices to be tested in spite of electrical energy noise and other noises which may interfere with the signal so that it would be otherwise unreadable by the local circuitry for the device to be tested. Thus, the use of digital transmission of the data allows a spread spectrum signal to be applied over a trailer's mutliplexed lines so that the signal can be reliably read by the local circuitry for the respective device to be tested.

Figure 6:
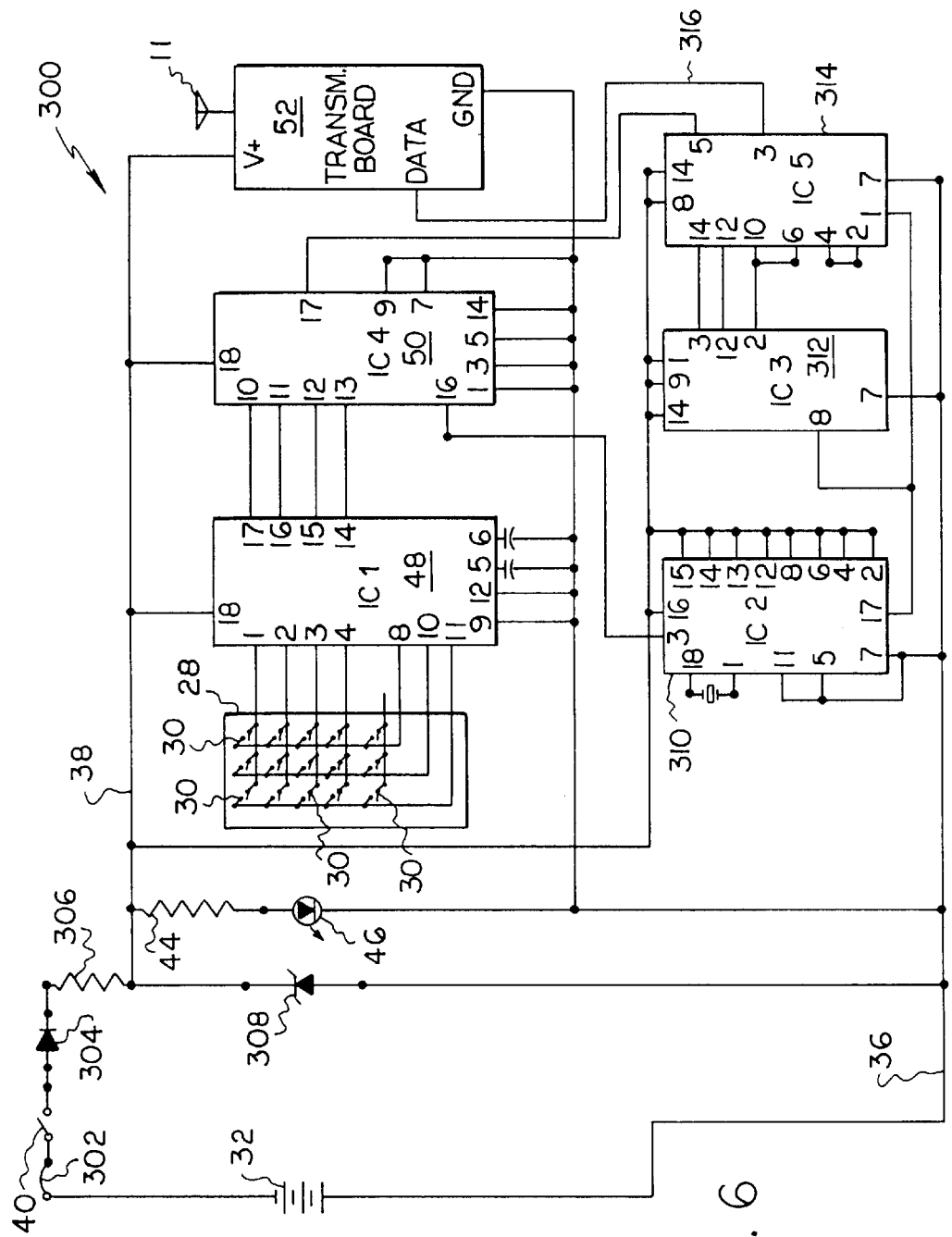
FIG. 6 is a schematic view of an alternative embodiment of the transmitter.
Figure 8:
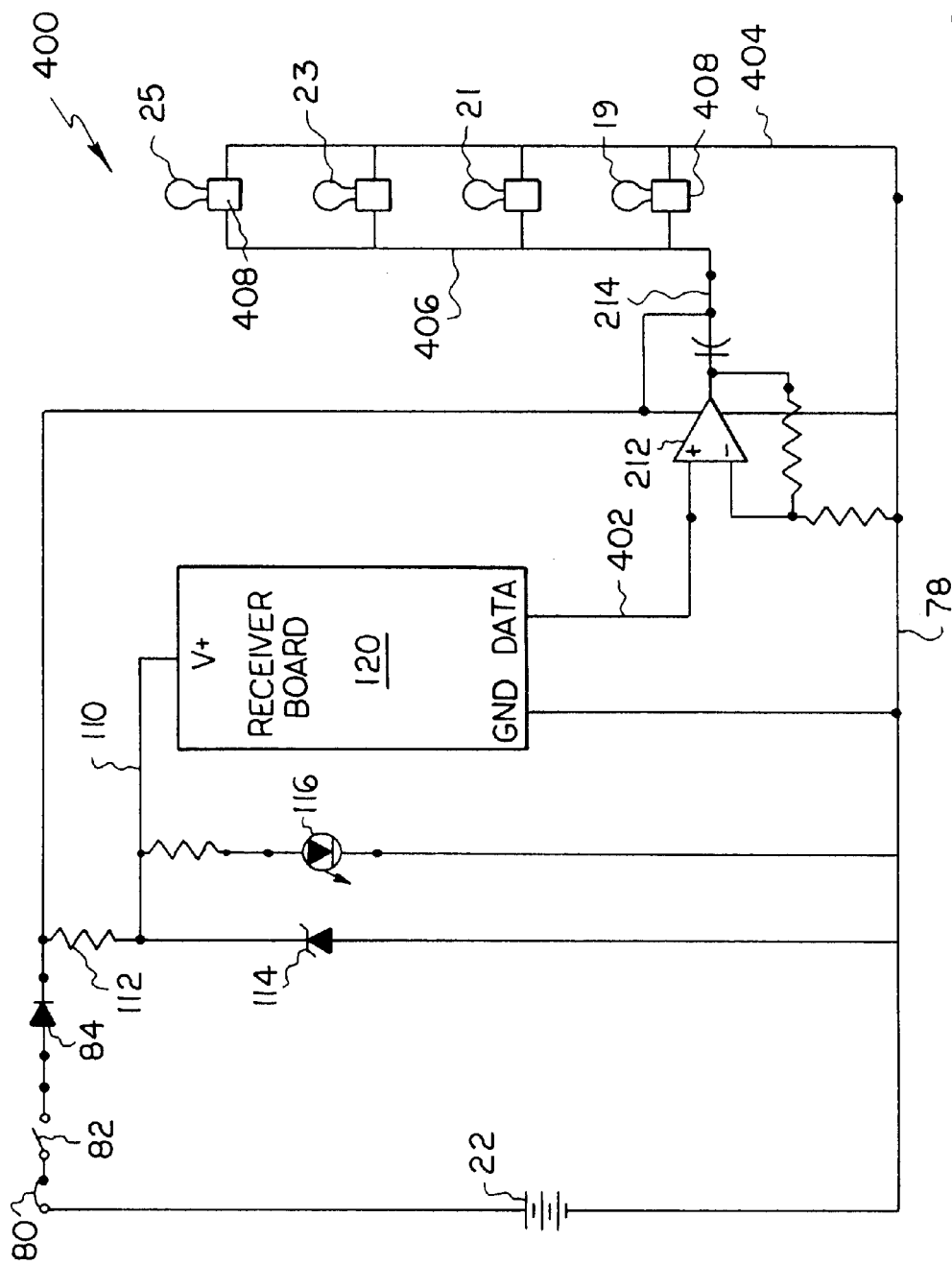
FIG. 8 is a schematic view of a receiver for use with the transmitter of FIG. 6.

Referring to FIG. 6, the direct sequence spread spectrum may alternatively be achieved in the transmitter, illustrated generally at 300, and then transmitted to a receiver, illustrated at 400 in FIG. 8, where it is received and processed for output on the multiplexed lines of the trailer 16. Upon closure of on/off switch 40, power is applied via lines 36 and 38 through a suitable fuse 302, a diode 304 which provides reverse power protection, and resistor 306 which acts to limit current. Zener diode 308 shunts off any over-voltage thereby acting as a voltage regulator. A light emitting diode 46, which is in parallel with zener diode 308, produces light to signal that the transmitter 300 is active. A voltage limiting resister 44 is in series with LED 46. Power is supplied via lines 36 and 38 in parallel to each of the transmitter board 52, encoder circuit 50, keyboard encoder 48, and integrated circuits 310, 312, and 314.

Similarly as for transmitter 10, the keyboard encoder 48 scans for closure of a switch 30 on the membrane switch assembly 28. Upon detecting the closure of a switch 30, the keyboard encoder 48 outputs a digital equivalent for the particular switch 30 to the encoding circuit 50. The encoding circuit 50 then produces a digital bit stream (including perhaps 4 bits identifying the transmitter and 4 bits identifying the device in the trailer to be turned on) and sends this bit stream to integrated circuit 314 for mixing. Integrated circuit 310 is configured to act as a crystal controlled pulse generator for each of integrated circuits 50, 312, and 314. Integrated circuit 312 is configured to produce a pseudorandom digital sequence which it outputs to integrated circuit 314. Integrated circuit 314 mixes the pseudorandom digital sequence with the digital bit stream to produce a direct sequence spread spectrum which is then output to the transmitter board 52 via line 316.

Integrated circuits 208 and 312 may, for example, be no. 74C154, and integrated circuits 202 and 314 may, for example, be no. CD4070, which integrated circuits are marketed by any number of companies including Motorola and National Semiconductor. Integrated circuits 206 and 310 may, for example, be no. AY-5-8116 distributed by Jameco of Belmont, Calif.

Since the signal from transmitter 300 is received at the receiver 400 in the form to be transmitted over the trailer's multiplex lines, the receiver need only receive, amplify, and deliver the signal onto the multiplex lines. Thus, the receiver board 120, upon reception of the signal, decodes it, similarly as previously discussed, and sends it along line 402 to integrated circuit 212 for amplification. The amplified signal is then placed on carrier and power lines 78 and 214, which are suitably connectable to the trailer's multiplex lines 404 and 406 respectively for transmission onto the multiplexed carrier lines in the trailer 16. The devices such as various lights 19, 21, 23, and 25 are connected to lines 404 and 406 in parallel with each other. Each device to be tested has conventional local circuit means, illustrated at 408, to sample the signal and, upon detection of the predetermined specific signal for the device, causes the device to be turned on for testing thereof, as illustrated at 18 in FIG. 1 for light (or group of lights) 19.

Figure 9:
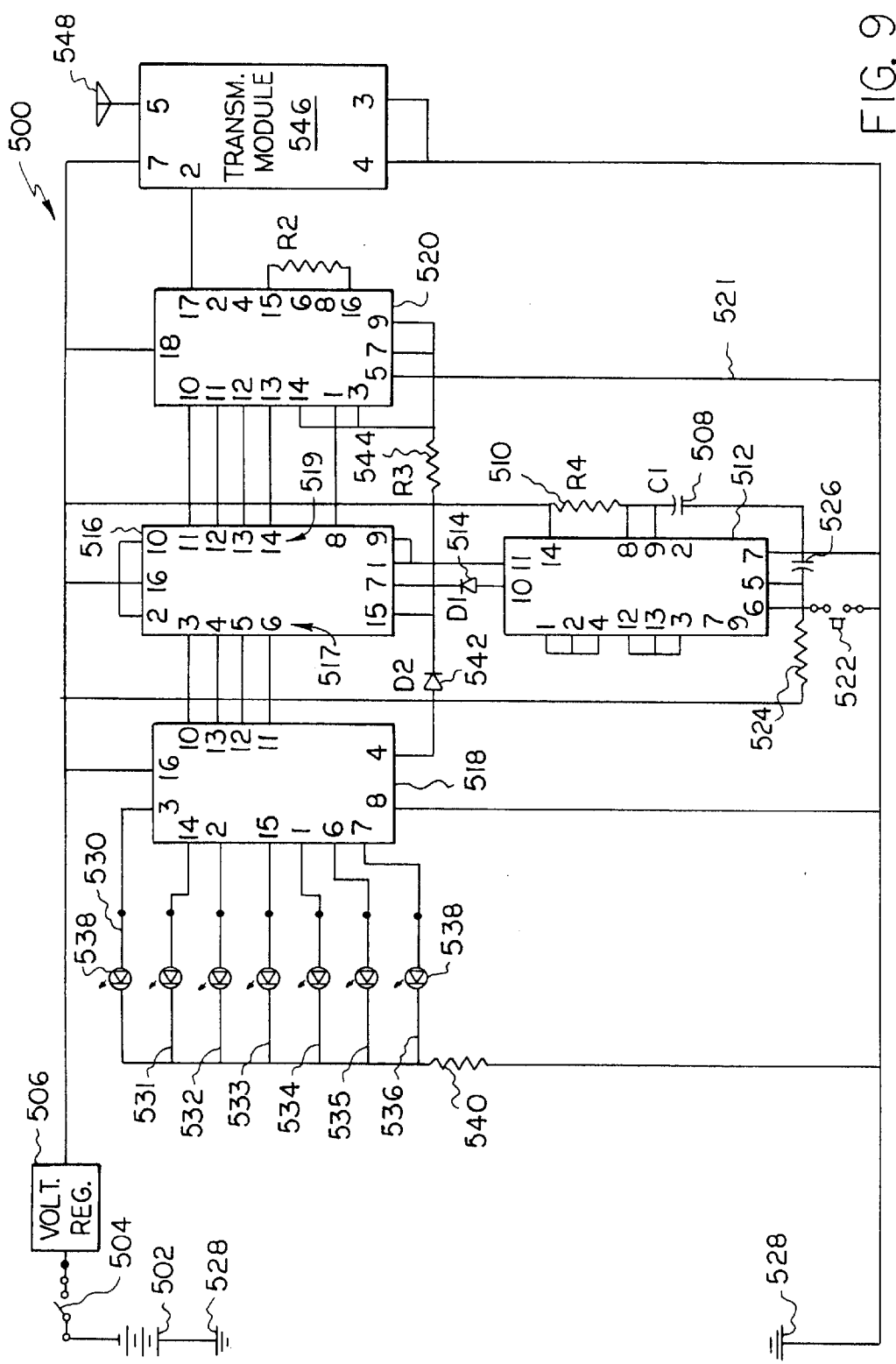
FIGS. 9 and 10 are schematic views of a transmitter and a receiver respectively of another embodiment of the present invention.
Figure 10:
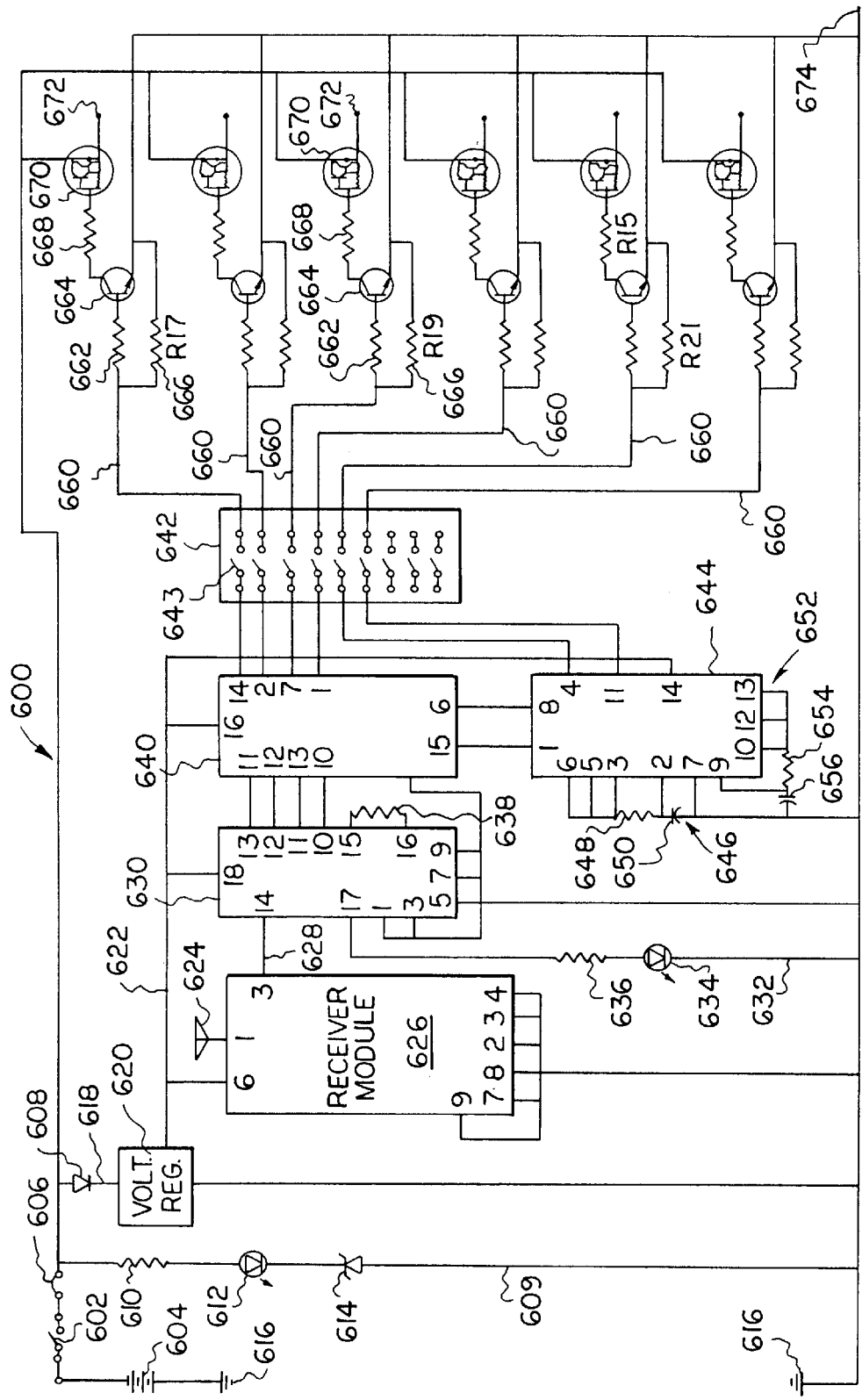

Referring to FIGS. 9 and 10, there are illustrated generally at 500 and 600 a transmitter and receiver respectively in accordance with another embodiment of the present invention. Except as otherwise described herein, the transmitter 500 and receiver 600 are similar to transmitter 10 and receiver 20 respectively.

The transmitter 500 is powered by a 9-volt battery 502 or other suitable electrical power source. When switch 504 is closed, the circuit to the battery 502 is completed, and current is supplied to integrated circuit 506, which then regulates the voltage to, for example, 5 volts. Integrated circuit may, for example, be National Semiconductor part no. LM78L05C. When power is applied for the first time to the circuit after being turned on, a charge is placed on capacitor 508 through resistor 510. When the voltage level on capacitor 508 becomes high enough, the output level on pin 10 in integrated circuit 512 is caused to go from high to low. This signal passes through diode 514, which is provided to stop any feedback in line in which diode 514 is contained. The signal passes to pins 7 and 15 of integrated circuit 516 which has a first counter, illustrated at 517, comprising pins 3, 4, 5, and 6 and a second counter, illustrated at 519, comprising pins 11, 12, 13, and 14. The transition from a high level to a low level on these pins causes both counter circuits 517 and 519 to reset to a digital zero value. This also allows the counters 517 and 519 to start counting.

Switch 522 is a normally open push-button switch. One side of switch 522 is tied to a common point between resistor 524 and capacitor 526, and the other side thereof is connected to ground, illustrated at 528. Upon closure of the switch 522, the charge on capacitor 526 is dumped, causing a pulse from low level to high level to be produced at pin 4 of integrated circuit 512, which is connected to pins 1 and 2 of integrated circuit 512. Their output at pin 3 of integrated circuit 512 is connected to pins 12 and 13 of integrated circuit 512. Their output at pin 11 of integrated circuit 512 is then connected to pins 1 and 9 of integrated circuit 516, and both counters 517 and 519 are as a result incremented by one. The count in binary form from the first counter 517 (on pins 3, 4, 5, and 6 of integrated circuit 516) goes to integrated circuit 518. The same count in binary form from the second counter 5 19 (on pins 11, 12, 13, and 14 of integrated circuit 516) goes to integrated circuit 520.

Upon receipt of a binary signal from counter 517 (pins 3, 4, 5, and 6 thereof) of integrated circuit 516, integrated circuit 518 will activate an appropriate output line 530 to 536 changing it from a low to a high level. At start-up, counters 517 and 519 of integrated circuit 516 output the digital equivalent of zero to integrated circuits 518 and 520 respectively, and this corresponds to output line 530. Integrated circuit 518 then activates line 530 at pin 3 thereof. This line 530 goes from low to a high level allowing current to flow through light emitting diode 538. Light from diode 530 gives the viewer a visual indication that line 530 is being activated. Each of the other lines 531 to 536 also has a light emitting diode 38 to indicate that its respective line is being activated. Current through diode 538 is controlled by resister 540, which also controls the current through the other diodes 538 for digital equivalents of one through six respectively.

When integrated circuit 518 receives the digital equivalent of seven, pin 4 of integrated circuit 518 goes high, and this signal passes through diode 542, which acts to block any feedback to pin 4 of integrated circuit 518. This signal then connects to pins 7 and 15 of integrated circuit 516, causing both counters 517 and 519 for integrated circuits 518 and 520 respectively to re-set. Also connected to pins 7 and 15 is resistor 544, which normally holds the level on these pins to ground.

Integrated circuit 520 acts as a digital encoder with pins 1 through 8 (pins 1, 3, 5, and 7 are shown connected to ground 528 via line 521 thereby providing a binary code of 0, and pins 2, 4, 6, and 8 are shown ungrounded thereby providing a binary code of 1) thereof providing a unique digital identity to which is added the digital equivalent of the count (via pins 10, 11, 12, and 13). The resulting digital sequence, which identifies a device on the trailer to be tested, is set out on pin 17 on integrated circuit 520 and delivered to pin 2 on transmitter module 546 for wireless transmission via antenna 548. The transmitter module 546 may, for example, be part no. TXM-418-LC provided by Linx Technologies of Medford, Oreg.

Referring to FIG. 10, upon closure of switch 602 for receiver 600, the circuit is completed and current, supplied by battery 604, flows through a circuit, illustrated at 609, which includes resistor 610, light-emitting diode 612, and diode 614. Resistor 610 is provided to act as a current limiter for light-emitting diode 612, which illuminates when current flows through it to indicate that the receiver 600 is on. As long as the voltage is high enough, some current will flow through diode 614 to ground, illustrated at 616.

Current also flows through a circuit, illustrated at 618, which is parallel to circuit 609, wherein the current flows through diode 608, which is provided to prevent power reversal in the circuit 618, then through voltage regulator 620 for regulating voltage output along line 622 to, for example, 5 volts for use as a power supply to various circuit parts as described hereinafter.

Upon reception of a signal via antenna 624 from the transmitting unit 500, the receiving module 626 converts the signal into a digital output which is sent via line 628 to pin 14 of integrated circuit 630. This chip 630 is provided to check whether the signal is coded with the identity of transmitter 500 and, if so confirmed, to output the digital count equivalent via pins 10, 11, 12, and 13 thereof. The receiver module 626 may, for example, be part no. RXM-418-LC provided by Linx Technologies of Medford, Oreg.

Upon confirmation of a valid signal (i.e., one having the unique digital code of transmitter 500), pin 17 of chip 630 goes high to allow current to flow along line 632 through light-emitting diode 634, which then illumines to give the operator a visual indication of proper signal reception from transmitter 500. Current through diode 634 is limited by resistor 636, which completes the circuit through line 632 to ground 616.

Resistor 638 is provided to control the internal clock speed of chip 630. The digital output from chip 630 is input to integrated circuit or chip 640 via pins 10, 11, 12, and 13 thereof. Chip 640 then activates the appropriate output line as follows. The outputs from pins 1, 2, 6, 7, 14, and 15 thereof correspond to the digital equivalents respectively of the count as transmitted by transmitter 500. For example, count 1 from transmitter 500 may have its output line from pin 14 of chip 640, and its output line would be the only output line from chip 640 activated in case of a signal received from transmitter 500 corresponding to count 1. The outputs from pins 1, 2, 7, and 14 of chip 640 are shown to connect directly to individual switches 643 respectively in a safety override switch means 642, which is provided to disable an output line which, if activated by the circuit, may cause a function that causes a hazardous situation to occur. The individual switches thereof, illustrated at 643, while shown open, would normally be closed. The output from pin 15 of chip 640 is shown to be connected to integrated circuit or chip 644 via pin 1 thereof. The change from a low voltage level to a high voltage level at pin 15 of chip 640 and thus at pin 1 of chip 644 due to the receipt of the binary signal causes an astable multivibrator circuit, illustrated at 646, comprising resistor 648 and capacitor 650 and an internal schmidt nand gate (not shown), of chip 644 to become active. The pulses from this output at pin 3 of chip 644 are connected to pins 5 and 6 thereof to cause an inverted signal to be output from pin 4 thereof to a respective individual switch 643 in the safety override switch means 642. Similarly, the output from pin 6 of chip 640 is shown to be connected to integrated circuit or chip 644 via pin 8 thereof. The change from a low voltage level to a high voltage level at pin 6 of chip 640 and thus at pin 8 of chip 644 due to the receipt of the binary signal causes an astable multivibrator circuit, illustrated at 652, comprising resistor 654 and capacitor 656 and another internal schmidt nand gate (not shown), of chip 644 to become active. The pulses from this output at pin 10 of chip 644 are connected to pins 12 and 13 thereof to cause an inverted signal to be output from pin 11 thereof to a respective individual switch 643 in the safety override switch means 642.

Individual switches 643 are connected respectively to individual parallel circuits, illustrated at 660. One of these circuits 660 will be described, it being understood that the others of the circuits 660 are similar thereto. Switch 643 is connected to resistor 662 then to the base of transistor 664, and resistor 666, which is provided to pull the line 660 to ground if the respective switch 643 is opened, is parallel therewith. The emitter of transistor 664 is connected to ground 616. Upon a level change from low to high, current starts to flow through resistor 662 and causes transistor 664 to conduct current, and resistor 662 acts to control the current level through the transistor 664. When transistor 664 starts conducting, current starts flowing through the collector of the transistor 664 to the resistor 668, which acts to control the current level to acceptable levels, then to the base of transistor 670. The transistor 664 and resistors 662 and 668 are provided to act as a level translator for transistor 670. With current flowing through the base of transistor 670, the transistor 670 then passes output power to a respective receptacle, illustrated at 672, of plug 106 (FIG. 4) and thence through the interconnecting lines to the device to be tested, with return to ground via receptacle 674. Due to its resistance, transistor 670 is provided with suitable heat sink material to release heat. Upon a change at the respective output pin of chip 640 from high to low, the respective receptacle 672 is cut-off from the power source 604 due to the respective transistor 670 stopping conducting.

It should be understood that, while the present invention has been described in detail herein, the invention can be embodied otherwise without departing from the principles thereof, and such other embodiments are meant to come within the scope of the present invention as defined by the appended claims.

What is claimed is:

1. Apparatus for testing operation of devices on a vehicular trailer, the apparatus comprising means including a first electrical power source for encoding and wirelessly transmitting a plurality of different digital signals each corresponding to one of the devices, said encoding and transmitting means including a plurality of switches each corresponding to one of the devices, a transmitter, means for detecting closure of one of said switches and for inputting to said transmitter a serial bit stream corresponding thereto along with a digital code identifying said transmitter as originator thereof, the apparatus further comprising a second electrical power source, means for receiving the wirelessly transmitted signals, and means responsive to the digital signals received by said receiving means for connecting said second power source to the corresponding devices respectively whereby a preselected device is tested by transmitting the serial bit stream corresponding to the preselected device along with the digital code identifying said transmitter as originator thereof.

2. Apparatus according to claim 1 wherein said encoding and transmitting means includes means for mixing each of the digital signals with a pseudorandom digital sequence to provide a spread spectrum for each of the signals.

3. Apparatus according to claim 1 wherein said receiving means includes means for mixing each of the received signals with a pseudorandom digital sequence to provide a spread spectrum for each of the signals.

4. Apparatus according to claim 1 further comprising means for applying the received signals to multiplexed lines in the trailer for receipt of the signals by the devices respectively to be tested.

5. Apparatus according to claim 4 wherein said applying means includes means for mixing each of the signals with a pseudorandom digital sequence to provide a spread spectrum for each of the signals.

6. Apparatus according to claim 1 wherein the apparatus is operable independently of connection of a tractor to the trailer.

7. Apparatus according to claim 1 wherein said transmitting means comprises means for transmitting the signals electromagnetically.

8. Apparatus according to claim 1 further comprising means for providing a spread spectrum for each of the signals.

9. Apparatus according to claim 1 further comprising means for providing a direct sequence spread spectrum for each of the signals.

10. A method for testing operation of devices on a vehicular trailer, the method comprising encoding and wirelessly transmitting a plurality of different digital signals each corresponding to one of the devices, the step of encoding and transmitting including closing one of a plurality of switches each corresponding to one of the devices, detecting closure of said one switch, and inputting to a transmitter a serial bit stream corresponding to said one switch along with a digital code identifying the transmitter as originator thereof, the method further comprising receiving the wirelessly transmitted signals, and connecting in response to each of the received signals a power source to the corresponding device for which the signal is received whereby a preselected device is tested by transmitting the serial bit stream corresponding to the preselected device along with the digital code identifying the transmitter as originator thereof.

11. A method according to claim 10 wherein the step of encoding includes mixing each of the signals with a pseudorandom digital sequence to provide a spread spectrum for each of the signals.

12. A method according to claim 10 further comprising mixing each of the received signals with a pseudorandom digital sequence to provide a spread spectrum for each of the signals.

13. A method according to claim 10 wherein the method is usable independently of connection of a tractor to the trailer.

14. A method according to claim 10 wherein the step of transmitting the signals comprises transmitting the signals electromagnetically.

15. A method according to claim 10 further comprising providing a spread spectrum for each of the signals.

16. A method according to claim 10 further comprising providing a direct sequence spread spectrum for each of the signals.

* * * * *